(12) United States Patent
Nakamura

(10) Patent No.: US 10,079,166 B2
(45) Date of Patent: Sep. 18, 2018

(54) PROCESSING APPARATUS

(71) Applicant: DISCO CORPORATION, Tokyo (JP)

(72) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 216 days.

(21) Appl. No.: 15/148,349

(22) Filed: May 6, 2016

(65) Prior Publication Data

US 2016/0343599 A1 Nov. 24, 2016

(30) Foreign Application Priority Data

May 18, 2015 (JP) ................................. 2015-100786

(51) Int. Cl.
| | | |
|---|---|---|
| *G05B 19/04* | (2006.01) | |
| *G05B 19/18* | (2006.01) | |
| *H01L 21/677* | (2006.01) | |
| *H01L 21/67* | (2006.01) | |
| *H01L 21/68* | (2006.01) | |

(52) U.S. Cl.
CPC .. *H01L 21/67778* (2013.01); *H01L 21/67092* (2013.01); *H01L 21/67259* (2013.01); *H01L 21/681* (2013.01)

(58) Field of Classification Search
CPC ......... H01L 21/67092; H01L 21/67259; H01L 21/67778; H01L 21/681
See application file for complete search history.

(56) References Cited

U.S. PATENT DOCUMENTS

| | | | | |
|---|---|---|---|---|
| 4,042,119 A | * | 8/1977 | Hassan | .................. B23Q 1/621 269/56 |
| 6,383,948 B1 | * | 5/2002 | Kitano | .................. B05C 5/0208 118/52 |
| 7,005,368 B1 | * | 2/2006 | Narita | .............. H01L 21/67138 438/110 |
| 2002/0088393 A1 | * | 7/2002 | Kitano | .................. B05C 5/0208 118/305 |
| 2003/0221713 A1 | * | 12/2003 | Egashira | ................... B08B 3/02 134/149 |
| 2006/0104795 A1 | * | 5/2006 | Mimken | ........... H01L 21/67057 414/744.7 |
| 2009/0028673 A1 | * | 1/2009 | Bonora | ............. H01L 21/67775 414/217.1 |
| 2014/0003891 A1 | * | 1/2014 | Kobayashi | ........ H01L 21/67173 414/217 |

FOREIGN PATENT DOCUMENTS

| | | |
|---|---|---|
| JP | 2002-066865 | 3/2002 |
| JP | 2004-322168 | 11/2004 |

* cited by examiner

*Primary Examiner* — Harry Y Oh
(74) *Attorney, Agent, or Firm* — Greer Burns & Crain Ltd.

(57) ABSTRACT

A temporary receiving unit of a processing apparatus includes a first support rail having a first bottom wall and a first side wall for guiding a workpiece for sliding movement in unloading and loading directions of the workpiece by an unloading and loading unit, a second support rail disposed in an opposing relationship to the first support rail and having a second bottom wall and a second side wall for guiding a workpiece for sliding movement, a support rail actuation unit for actuating the first support rail and the second support rail in directions in which the first support rail and the second support rail approach each other and are spaced away from each other, and a load detection unit for detecting a load on the support rail actuation unit.

3 Claims, 6 Drawing Sheets

US 10,079,166 B2

PROCESSING APPARATUS

BACKGROUND OF THE INVENTION

Field of the Invention

The present invention relates to a processing apparatus such as a cutting apparatus for performing cutting processing or a laser processing apparatus for performing laser processing for a workpiece such as a semiconductor wafer.

Description of the Related Art

In a semiconductor device fabrication process, a plurality of regions are partitioned by scheduled division lines arrayed in a lattice pattern on the surface of a semiconductor wafer of a substantially disk shape, and devices such as ICs or LSIs are formed in the partitioned regions. Then, the semiconductor wafer is divided along the scheduled division lines to fabricate the individual semiconductor devices.

A method of dividing a wafer such as a semiconductor wafer along scheduled division lines is normally performed by a cutting apparatus called dicer. The cutting apparatus includes a chuck table for holding a workpiece such as a wafer, cutting means for cutting the workpiece held on the chuck table, cassette receiving means for receiving a cassette placed thereon and having a plurality of workpieces accommodated therein, unloading and loading means for unloading and loading a workpiece from and into the cassette placed on the cassette receiving means, temporary receiving means for temporarily receiving the workpiece unloaded by the unloading and loading means and placed thereon, and workpiece transport means for transporting the workpiece temporarily placed on the temporary receiving means to the chuck table. The cutting apparatus configured in this manner divides a wafer held on the chuck table into individual devices by cutting the wafer along scheduled division lines by the cutting means (refer to, for example, Japanese Patent Laid-Open No. 2002-66865).

Meanwhile, as another method of dividing a wafer such as a semiconductor wafer along scheduled division lines, a technology for performing ablation processing by irradiating a pulse laser beam of a wavelength having an absorbency to the wafer along scheduled division lines to form laser processed grooves serving as fracture starting points and applying external force along the scheduled division lines along which the laser processed grooves serving as the fracture starting points are formed to cut the wafer has been put into practical use (refer to, for example, Japanese Patent Laid-Open No. 2004-322168). Also a technology for performing ablation processing for a wafer along scheduled division lines to fully cut the wafer along the scheduled division lines has been proposed.

A laser processing apparatus for forming laser processed grooves along scheduled division lines on a wafer such as a semiconductor wafer as described above includes a chuck table for holding a workpiece, laser beam irradiation means for irradiating a pulse laser beam on the workpiece held on the chuck table, cassette receiving means for receiving a cassette placed thereon and having a plurality of workpieces accommodated therein, unloading and loading means for unloading and loading a workpiece from and into the cassette placed on the cassette receiving means, temporary receiving means for temporarily receiving the workpiece unloaded by the unloading and loading means and placed thereon, and workpiece transport means for transporting the workpiece temporarily placed on the temporary receiving means to the chuck table. The laser processing apparatus configured in this manner forms laser processed grooves on a wafer held on the chuck table by irradiating a laser beam along the scheduled division lines on the wafer (refer to, for example, Japanese Patent Laid-Open No. 2004-322168).

SUMMARY OF THE INVENTION

When a cutting groove or a laser processed groove is to be formed on a wafer by the cutting apparatus or the laser processing apparatus described above, the formation is performed in a state in which a wafer is stuck at the rear face thereof to the front face of a dicing tape whose outer peripheral portion is mounted so as to cover an inner side opening portion of an annular frame. Accordingly, the wafer is accommodated as a wafer unit supported on an annular frame with a dicing tape interposed therebetween in a cassette. Thus, when the wafer after processing is performed is accommodated from the temporary receiving means into the cassette placed on the cassette receiving means, an image of the wafer, which moves under the guidance of a pair of supporting rails which configure the temporary receiving means, is picked up by image pickup means to verify the processed state of the wafer.

However, the annular frame which supports a wafer through the dicing tape and the pair of supporting rails which configure the temporary receiving means have a gap of approximately 1 mm to 2 mm therebetween. Consequently, when the annular frame is moved toward the cassette placed on the cassette receiving means, the cassette is rocked. Therefore, there is a problem that an appropriate image cannot be acquired.

Accordingly, it is an object of the present invention to provide a processing apparatus which can move a workpiece smoothly along a support rail which configures temporary receiving means without causing rocking movement of the workpiece.

In accordance with an aspect of the present invention, there is provided a processing apparatus, including a chuck table configured to hold a workpiece thereon, processing means for processing the workpiece held on the chuck table, cassette receiving means for receiving a cassette placed thereon and having a plurality of workpieces accommodated therein, unloading and loading means for unloading and loading a workpiece from and to the cassette placed on the cassette receiving means, temporary receiving means for temporarily receiving thereon the workpiece unloaded by the unloading and loading means, workpiece transport means for transporting the workpiece temporarily placed on the temporary receiving means to the chuck table, and a controller. The temporary receiving means includes a first support rail having a first bottom wall and a first side wall for guiding a workpiece for sliding movement in unloading and loading directions of the workpiece by the unloading and loading means, a second support rail disposed in an opposing relationship to the first support rail and having a second bottom wall and a second side wall for guiding a workpiece for sliding movement, support rail actuation means for actuating the first support rail and the second support rail in directions in which the first support rail and the second support rail approach each other and are spaced away from each other, and load detection means for detecting a load on the support rail actuation means. The controller is operable to receive, as an input thereto, a load signal from the load detection means when the support rail actuation means is actuated to move the first support rail and the second support rail so as to approach each other thereby to sandwich a workpiece between the first side wall and the second side wall and actuate, when a load value from the load detection means reaches a given value, the support rail actuation means so as to move the first support rail and the second support rail in the directions in which the first support rail and the second support rail are spaced away from each other by a given amount.

Preferably, the workpiece is a wafer having a surface having a plurality of regions partitioned by a plurality of scheduled division lines and devices formed in the regions, and the wafer is stuck to a surface of a dicing tape having an outer peripheral portion mounted such that a rear face thereof covers an inner side opening portion of an annular frame.

Preferably, image pickup means for picking up an image of the workpiece temporarily placed on the first support rail and the second support rail is disposed on an upper side of the temporary receiving means, and the image pickup means picks up an image of a processed state of the workpiece which moves along the first support rail and the second support rail when the processed workpiece is to be accommodated into the cassette placed on the cassette receiving means by the unloading and loading means.

With the processing apparatus of the present invention, when a workpiece transported to the first support rail and the second support rail which configure the temporary receiving means is to be moved toward a cassette placed on the cassette receiving means, the support rail actuation means is actuated to move the first support rail and the second support rail toward each other to sandwich the workpiece by and between the first side wall and the second side wall, whereupon, a load signal from the load detection means is inputted to the controller. If the load value from the load detection means reaches the given value, then the support rail actuation means is actuated to actuate the first support rail and the second support rail to move in the directions in which they are spaced way from each other by the given amount. Therefore, a very small gap of such a degree that no play appears between the first side wall of the first support rail and the second side wall of the second support rail and the workpiece is generated between the first side wall and the second side wall and the workpiece. Accordingly, the workpiece supported on the first support rail and the second support rail can move smoothly without making a rocking motion under the guidance of the first side wall of the first support rail and the second side wall of the second support rail. Therefore, when a workpiece is to be inserted from the temporary receiving means into a cassette placed on the cassette receiving means, an image of a processed state of cutting grooves, laser processed grooves and so forth formed by processing on the workpiece can be picked up appropriately.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
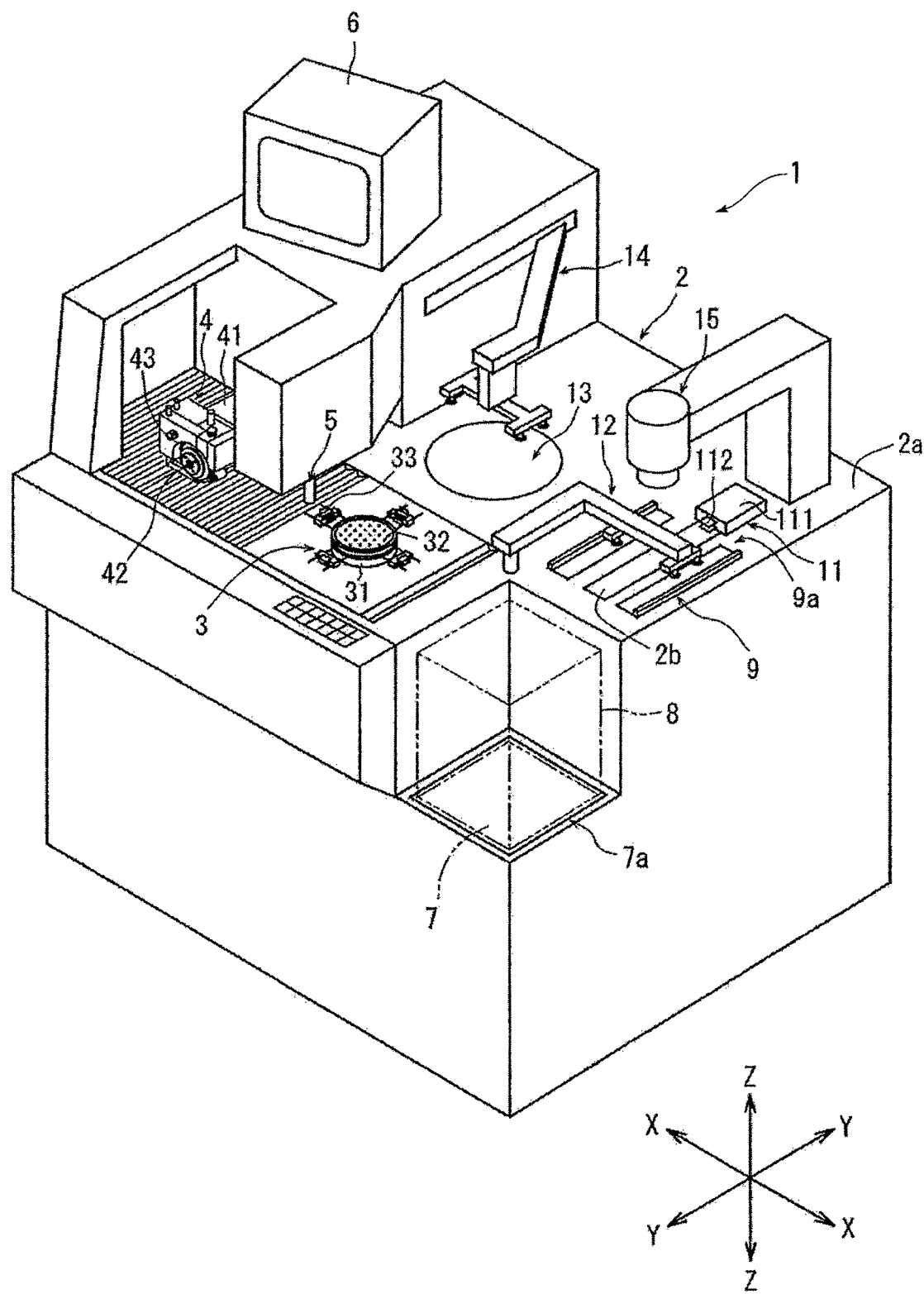
FIG. 1 is a perspective view of a cutting apparatus according to an embodiment of the present invention.

In the following, a preferred embodiment of a processing apparatus configured in accordance with the present invention is described in detail with reference to the accompanying drawings. FIG. 1 depicts a perspective view of a cutting apparatus 1 according to an embodiment of the present invention. The cutting apparatus 1 according to the present embodiment includes an apparatus housing 2 of a parallelepiped shape. In the apparatus housing 2, a chuck table 3 as a chuck table for holding a wafer unit hereinafter described is disposed for movement in a processing feeding direction which is a direction indicated by an arrow mark X (X-axis direction). The chuck table 3 includes a table main body 31 and an absorption chuck 32 disposed on the table main body 31. The chuck table 3 sucks and holds a workpiece of a wafer unit hereinafter described to and on a holding face which is an upper face of the absorption chuck 32 by rendering suction means not depicted operative. Further, the chuck table 3 is configured for rotation by a rotation mechanism not depicted. It is to be noted that, on the chuck table 3, a clamp mechanism 33 for fixing an annular frame of a wafer unit hereinafter described is disposed.

The cutting apparatus 1 in the present embodiment includes a spindle unit 4 as cutting means for performing cutting processing of a workpiece. The spindle unit 4 includes a spindle housing 41 mounted on a movable base not depicted and moved and adjusted in a direction (Y-axis direction) indicated by an arrow mark Y which is an indexing direction and a direction (Z-axis direction) indicated by an arrow mark Z which is a cutting direction, a rotary spindle 42 supported for rotation on the spindle housing 41, and a cutting blade 43 mounted at a front end portion of the rotary spindle 42. The cutting blade 43 is configured, in the present embodiment, from an electroformed blade formed by fixing diamond grain of a particle size of, for example, approximately 2 μm to 4 μm to a thickness of approximately 20 μm to a side face of a disk-shaped base made of aluminum by enamel plating and removing an outer peripheral portion of the base by etching such that a cutting edge of 2 mm to 3 mm is projected so as to form a circular shape. Further, the cutting apparatus 1 in the present embodiment includes alignment means 5 for picking up an image of a surface of a workpiece of a wafer unit hereinafter described held on the chuck table 3 and detecting a region to be cut by the cutting blade 43. The alignment means 5 includes image pickup means configured from optical means such as a microscope, a CCD camera and the like. Further, the cutting apparatus 1 includes display means 6 for displaying an image picked up by the alignment means 5, an image picked up by image pickup means hereinafter described or the like.

The cutting apparatus 1 in the present embodiment includes cassette receiving means 7 disposed in a cassette placement region 7a of the apparatus housing 2 for receiving a wafer unit hereinafter described placed thereon. The cassette receiving means 7 is configured for movement in upward and downward directions by lifting means not depicted.

Figure 2A:
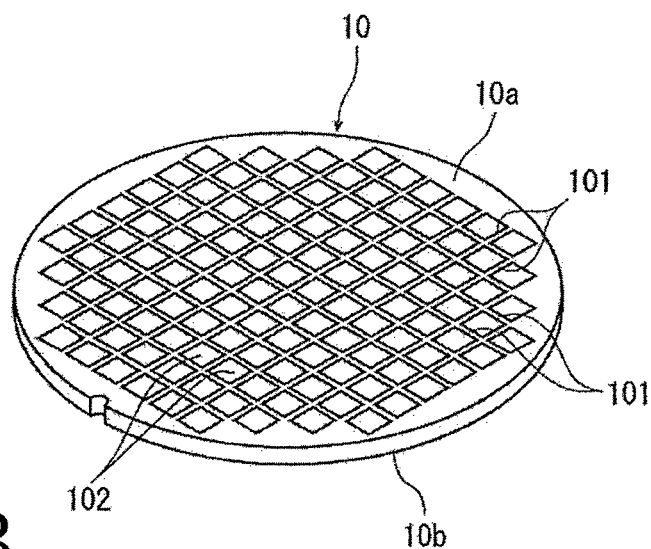
FIG. 2A is a perspective view of a semiconductor wafer which is processed by the cutting apparatus depicted in FIG. 1.

A cassette 8 in which a wafer unit hereinafter described is placed on the cassette receiving means 7. Here, the workpiece and the wafer unit are described with reference to FIGS. 2A and 2B. FIG. 2A depicts a perspective view of a semiconductor wafer as a workpiece. A semiconductor wafer 10 depicted in FIG. 2A is configured from a silicon wafer of a thickness of, for example, 600 µm. The semiconductor wafer 10 has a plurality of scheduled division lines 101 formed in a lattice pattern on a front face 10a thereof and has a device 102 such as an IC or an LSI formed in each of a plurality of regions partitioned by the plurality of scheduled division lines 101.

Figure 2B:
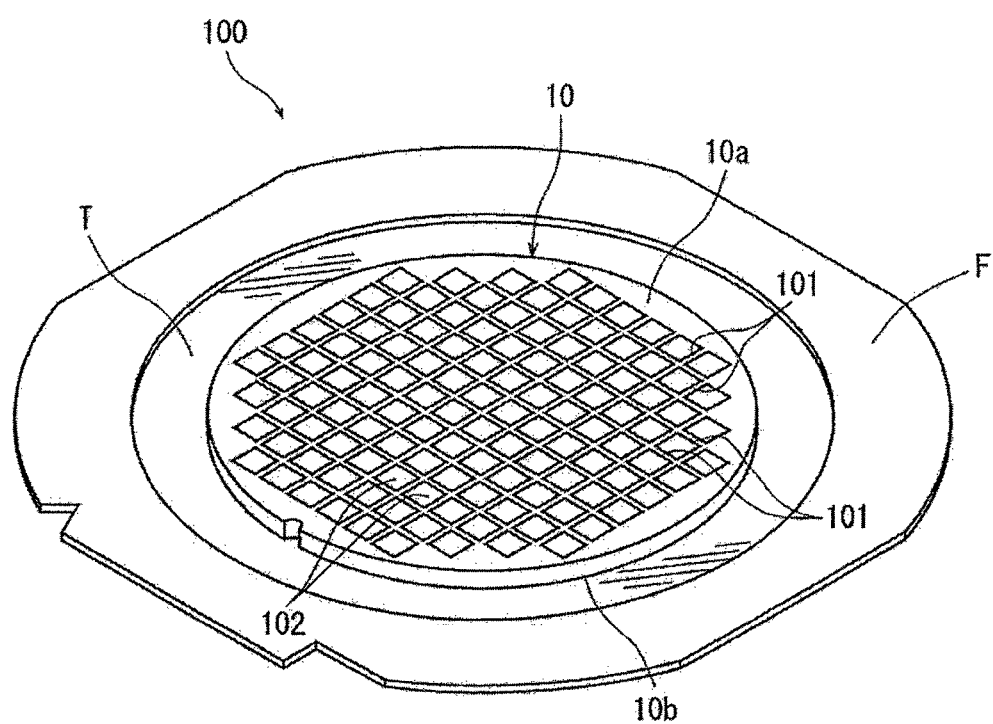
FIG. 2B is a perspective view depicting a wafer unit wherein the semiconductor wafer is supported on an annular frame with a dicing tape interposed therebetween.

The semiconductor wafer 10 described hereinabove is stuck at a rear face 10b thereof to a front face of a dicing tape T which is mounted such that an outer peripheral portion thereof covers an inner side opening portion of an annular frame F made of a metal material such as stainless steel as depicted in FIG. 2B. It is to be noted that the dicing tape T is formed, in the present embodiment, from a polyvinyl chloride (PVC) sheet. The semiconductor wafer 10 supported on the annular frame F with the dicing tape T interposed therebetween in this manner is accommodated as a wafer unit 100 in a cassette 8.

Referring back to FIG. 1, a temporary placement region 9a is set on a main supporting substrate 2a which covers an upper face of the apparatus housing 2, and temporary receiving means 9 for temporarily placing a wafer unit 100 in the temporary placement region 9a and carrying out positioning of a wafer unit 100. Further, the cutting apparatus 1 in the present embodiment includes unloading and loading means 11 for unloading and loading the wafer unit 100 accommodated in a cassette 8 placed on the cassette receiving means 7 from and into the temporary receiving means 9. The temporary receiving means 9 and the unloading and loading means 11 are hereinafter described with reference to FIGS. 3 and 4.

Figure 4:
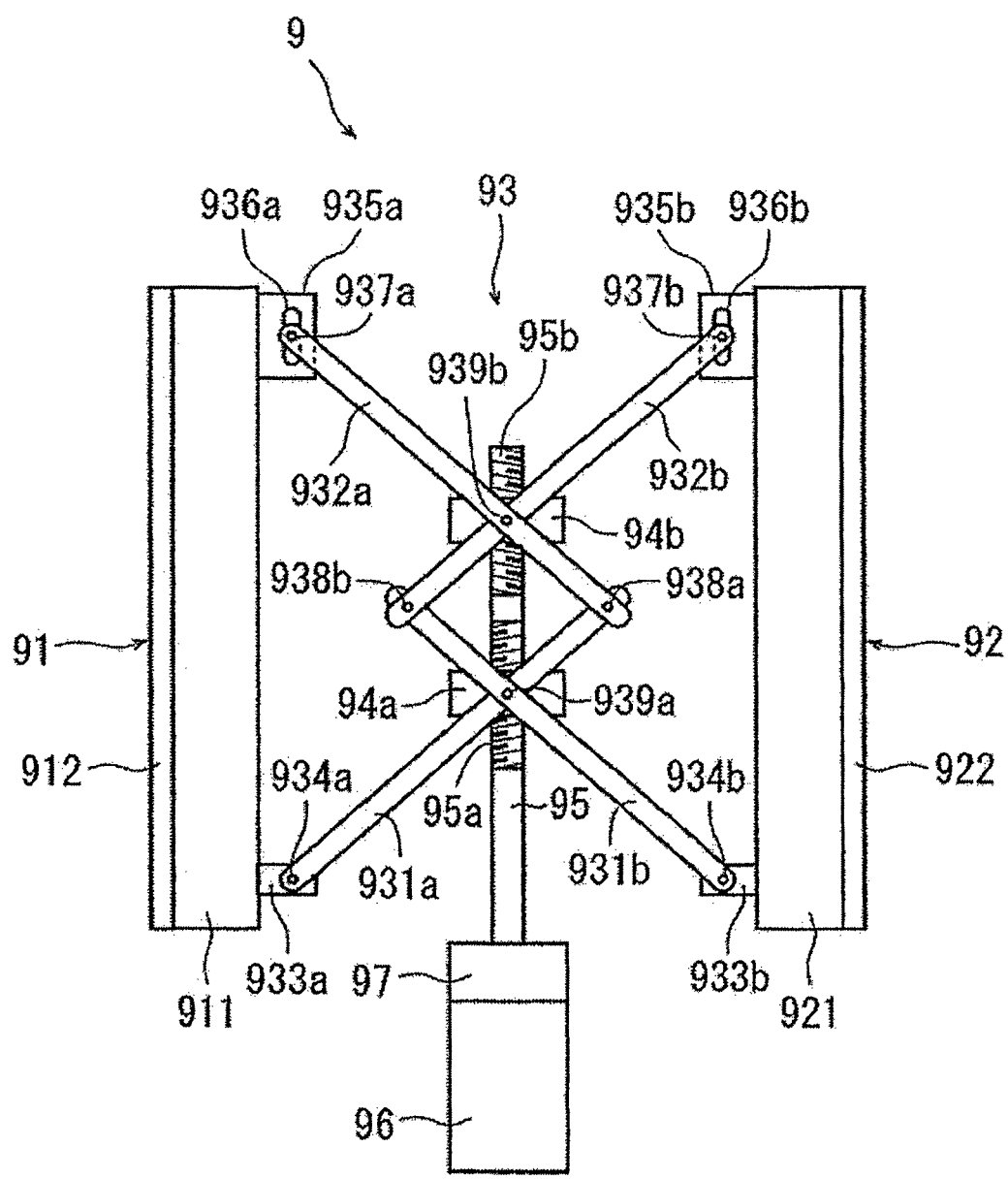
FIG. 4 is a top plan view of the temporary receiving means provided in the cutting apparatus depicted in FIG. 1.

The temporary receiving means 9 in the present embodiment includes a first support rail 91 and a second support rail 92 for guiding a workpiece for sliding movement in unloading and loading directions of the workpiece by the unloading and loading means 11. The first support rail 91 is configured from a first bottom wall 911 and a first side wall 912, and the second support rail 92 is configured from a second bottom wall 921 and a second side wall 922. The first support rail 91 and the second support rail 92 are disposed in an opposing relationship to each other. Further, the temporary receiving means 9 in the present embodiment includes support rail actuation means 93 for actuating the first support rail 91 and the second support rail 92 in directions in which they move toward and away from each other as depicted in FIG. 4. The support rail actuation means 93 includes first links 931a and 931b connected at one end thereof for rocking motion to one end portion in the longitudinal direction of the first support rail 91 and the second support rail 92, respectively, and second links 932a and 932b connected at one end portion thereof for rocking motion and for sliding movement in the longitudinal direction to the other end portion in the longitudinal direction of the first support rail 91 and the second support rail 92, respectively. The first link 931a and the second link 932a connected at one end thereof to the first support rail 91 are connected at the other end thereof for rocking motion to each other, and the first link 931b and the second link 932b connected at one end thereof to the second support rail 92 are connected at the other end thereof for rocking motion to each other.

The connection structure of the first links 931a and 931b and the second links 932a and 932b is described more particularly. The first links 931a and 931b are connected at one end thereof for rocking motion to first support brackets 933a and 933b mounted at one end portion in the longitudinal direction of the first support rail 91 and the second support rail 92 by pivots 934a and 934b, respectively. Further, the second links 932a and 932b are connected at one end thereof for rocking motion around and for sliding movement along elongated holes 936a and 936b to the elongated holes 936a and 936b, respectively. The elongated holes 936a and 936b are formed in second support brackets 935a and 935b mounted at the other end portion in the longitudinal direction of the first support rail 91 and the second support rail 92 by pivots 937a and 937b, respectively. In particular, the second link 932a is supported at one end thereof for rocking motion around and for sliding movement along the elongated hole 936a provided in the second support bracket 935a mounted at the other end portion in the longitudinal direction of the first support rail 91 by a pivot 937a. The second link 932b is supported at one end portion thereof for rocking motion around and for sliding movement along the elongated hole 936b provided in the second support bracket 935b provided at the other end portion in the longitudinal direction of the second support rail 92 by a pivot 937b. Thus, the first link 931a and the second link 932a supported at one end thereof on the first support rail 91 are connected at the other end thereof to each other for rocking motion by a pivot 938a, and the first link 931b and the second link 932b supported at one end thereof to the second support rail 92 are connected to each other at the other end thereof for rocking motion by a pivot 938b.

The first link 931a supported at one end thereof on the first support rail 91 and the first link 931b supported at one end thereof to the second support rail 92 are supported at a position thereof, at which intermediate portions thereof cross with each other, for pivotal motion by a pivot 939a, and a first movement block 94a is connected to the pivot 939a. Further, the second link 932a supported at one end thereof on the first support rail 91 and the second link 932b supported at one end thereof on the second support rail 92 are supported at a position thereof, at which intermediate portions thereof cross with each other, for pivotal motion by a pivot 939b, and a second movement block 94b is connected to the pivot 939b. It is to be noted that female threads threaded in the opposite directions to each other are provided in the first movement block 94a and the second movement block 94b.

Referring further to FIG. 4, the support rail actuation means 93 in the present embodiment includes a male thread rod 95 for being screwed with the first movement block 94a and the second movement block 94b, a stepping motor 96 (M) for rotationally driving the male thread rod 95, and a torque measuring instrument 97 serving as load detection means for detecting a load acting upon the stepping motor 96 (M). A first male thread 95a and a second male thread 95b are formed such that they are threaded in the opposite directions to each other on an outer periphery of the male thread rod 95. The female thread provided in the first movement block 94a is screwed with the first male thread 95a while the female thread provided in the second movement block 94b is screwed with the second male thread 95b. Accordingly, if the male thread rod 95 is rotated in the forward direction (forward rotational operation) by the stepping motor 96 (M), then the first movement block 94a and the second movement block 94b are moved in directions in which they are spaced away from each other, by which the first support rail 91 and the second support rail 92 connected by the first links 931a and 931b and the second links 932a and 932b are moved in directions in which they approach each other. On the other hand, if the male thread rod 95 is rotated in the reverse direction (reverse rotational operation) by the stepping motor 96 (M), then the first movement block 94a and the second movement block 94b move in directions in which they approach each other, by which the first support rail 91 and the second support rail 92 connected by the first links 931a and 931b and the second links 932a and 932b are moved in directions in which they are spaced away from each other. It is to be noted that the torque measuring instrument 97 detects load torque of the stepping motor 96 (M) and sends a load signal to a controller hereinafter described.

Referring back to FIGS. 1 and 3, the unloading and loading means 11 includes a movable block 111, and a pair of grip pieces 112 are disposed at an end of the movable block 111. The pair of grip pieces 112 are selectively positioned to an inactive state in which they are spaced away from each other in the upward and downward direction and an active state in which they approach each other to grasp an edge portion of an annular frame F of the wafer unit 100 therebetween. The main supporting substrate 2a has a groove 2b formed thereon so as to extend in the unloading and loading direction of a workpiece by the unloading and loading means 11 between and in parallel to the first support rail 91 and the second support rail 92. The movable block 111 of the unloading and loading means 11 is disposed for movement in the groove 2b and is moved along the groove 2b by actuation means not depicted.

Referring back to FIG. 1, the cutting apparatus 1 in the present embodiment includes first workpiece transport means 12 for transporting a wafer unit 100 transported to the temporary receiving means 9 to the chuck table 3, cleaning means 13 for cleaning the wafer unit 100 including a semiconductor wafer 10 processed by cutting on the chuck table 3, and second workpiece transport means 14 for transporting a wafer unit 100 including a semiconductor wafer 10 processed by cutting on the chuck table 3 to the cleaning means 13.

Figure 3:
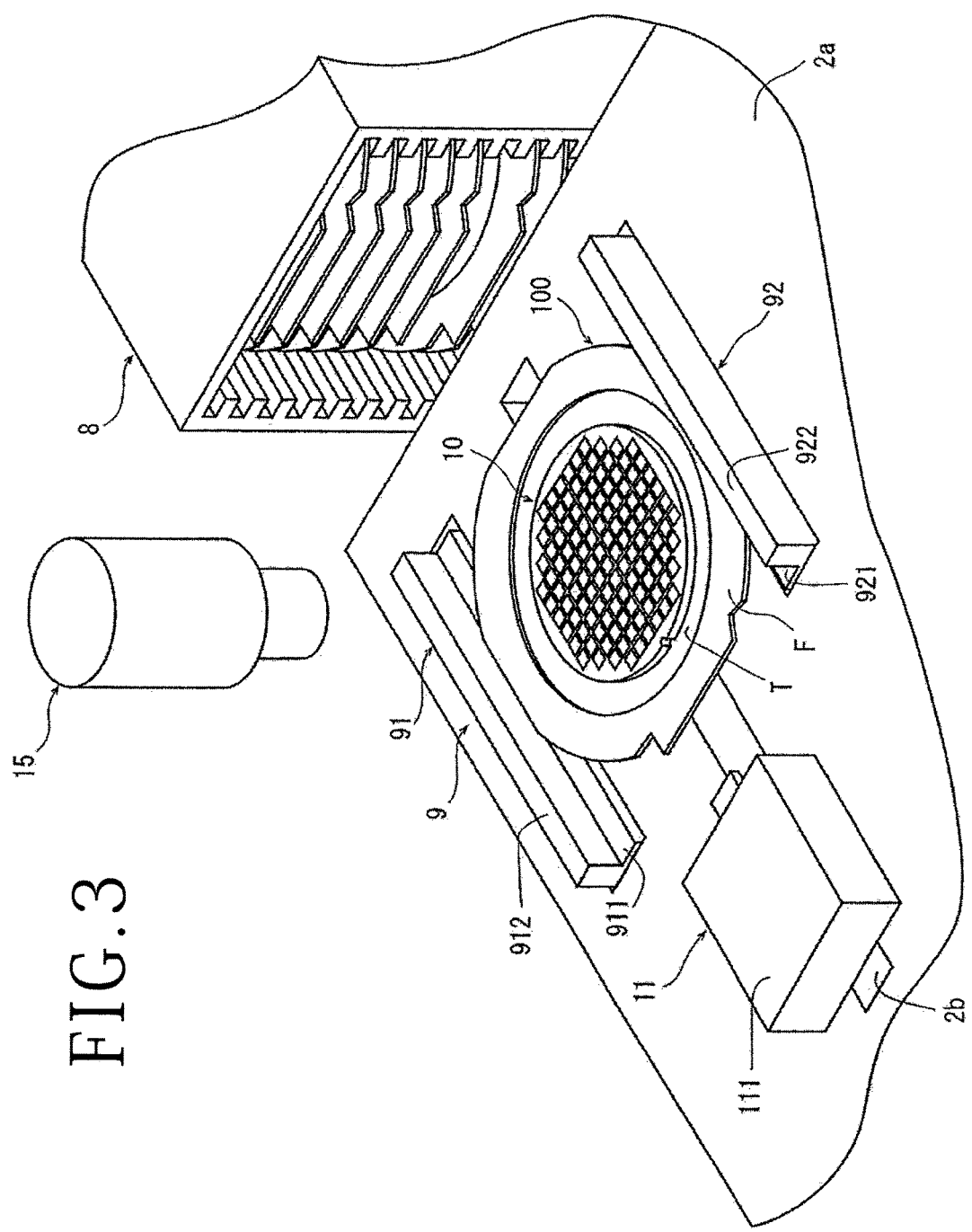
FIG. 3 is a perspective view illustrating a relationship among temporary receiving means, unloading and loading means, and image pickup means provided in the cutting apparatus depicted in FIG. 1.

Referring to FIGS. 1 and 3, the cutting apparatus 1 in the present embodiment includes image pickup means 15 for picking up an image of a workpiece disposed in an opposing relationship to the upper side of the temporary receiving means 9 and temporarily placed on the first support rail 91 and the second support rail 92. The image pickup means 15 picks up, when the wafer unit 100 including the semiconductor wafer 10 temporarily placed on the temporary receiving means 9 and processed by cutting is accommodated into the cassette 8 placed on the cassette receiving means 7 as cassette receiving means by the unloading and loading means 11, an image for a processed state of the semiconductor wafer 10 in the wafer unit 100 which moves along the first support rail 91 and the second support rail 92 and sends a picked up image signal to a controller hereinafter described.

Figure 5:
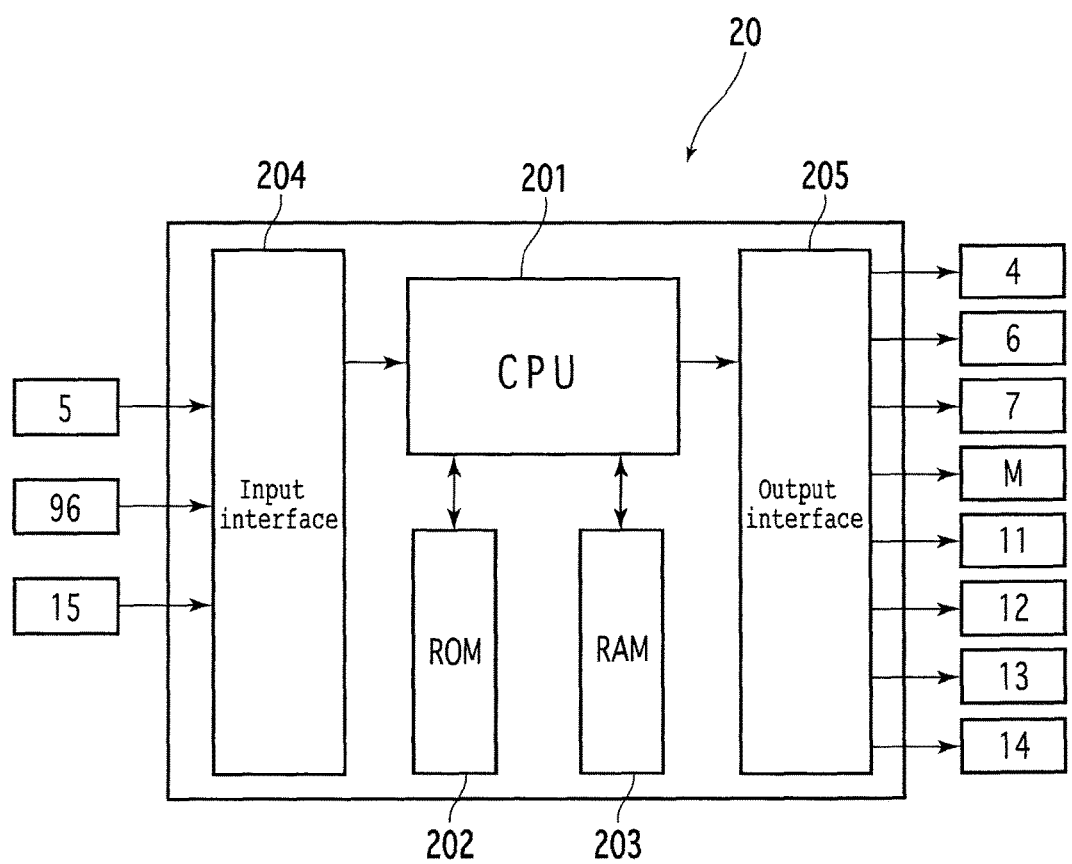
FIG. 5 is a block diagram of a controller provided in the cutting apparatus depicted in FIG. 1.

The cutting apparatus 1 includes a controller 20 depicted in FIG. 5. The controller 20 includes a central processing unit (CPU) 201 for performing arithmetic processing in accordance with a predetermined control program, a read only memory (ROM) 202 for storing the control program and so forth, a writable random access memory (RAM) 203 for storing a result of an arithmetic operation and so forth, and an input interface 204 and an output interface 205. To the input interface 204 of the controller 20 configured in this manner, detection signals from the alignment means 5, the stepping motor 96, the image pickup means 15 and so forth are inputted. Meanwhile, from the output interface 205, control signals are outputted to the spindle unit 4 as the cutting means, the display means 6, the cassette receiving means 7, the stepping motor 96 (M) configuring the support rail actuation means 93 of the temporary receiving means 9, the unloading and loading means 11, the first workpiece transport means 12, the cleaning means 13, the second workpiece transport means 14 and so forth.

The cutting apparatus 1 in the present embodiment is configured in such a manner as described above, and operation of the cutting apparatus 1 is described below with reference to FIGS. 1 and 4. The controller 20 first actuates the lifting means not depicted of the cassette receiving means 7 to move a cassette 8 placed on the cassette receiving means 7 upwardly and downwardly to position a wafer unit 100 accommodated at a predetermined position in the cassette 8 to the unloading position. Then, the controller 20 actuates the actuation means not depicted of the unloading and loading means 11 to move the movable block 111 forwardly until the annular frame F of the wafer unit 100 positioned at the unloaded position is grasped by the pair of grip pieces 112 to transport the wafer unit 100 and move the movable block 111 backwardly to transport the wafer unit 100 whose annular frame F is grasped by the pair of grip pieces 112 on the first bottom wall 911 of the first support rail 91 and the second bottom wall 921 of the second support rail 92 which configure the temporary receiving means 9.

Then, the controller 20 actuates the stepping motor 96 (M) configuring the support rail actuation means 93 of the temporary receiving means 9 to rotate forwardly to move the first movement block 94a and the second movement block 94b in the directions in which they are spaced away from each other thereby to move the first support rail 91 and the second support rail 92 connected to each other by the first links 931a and 931b and the second links 932a and 932b in the directions in which they approach each other. As a result, the annular frame F of the wafer unit 100 is sandwiched by the first side wall 912 of the first support rail 91 and the second side wall 922 of the second support rail 92, whereupon the load on the stepping motor 96 (M) increases. Then, the controller 20 decides whether or not the load signal from the torque measuring instrument 97 which detects the load on the stepping motor 96 (M) reaches, for example, 1 N·m. If the load signal from the torque measuring instrument 97 reaches 1 N·m, then the controller 20 decides that the annular frame F of the wafer unit 100 sandwiched by the first side wall 912 of the first support rail 91 and the second side wall 922 of the second support rail 92 is positioned at the predetermined position and actuates the stepping motor 96 (M) to rotate reversely by a predetermined amount (positioning process). As a result, the first movement block 94a and the second movement block 94b which have positioned the wafer unit 100 at the predetermined position are moved in the directions in which they approach each other, by which the first support rail 91 and the second support rail 92 connected to each other by the first links 931a and 931b and the second links 932a and 932b are moved by a predetermined amount in the directions in which they are spaced away from each other.

After the positioning process described above is carried out, the controller 20 actuates the first workpiece transport means 12 to transport the wafer unit 100 positioned by the first support rail 91 and the second support rail 92 of the temporary receiving means 9 to the chuck table 3. Since the wafer unit 100 transported to the chuck table 3 in this manner is positioned at the predetermined position on the temporary receiving means 9, it can be positioned accurately on the chuck table 3. After the wafer unit 100 is placed on the chuck table 3, the controller 20 actuates the suction means not depicted to suck and hold the semiconductor wafer 10 of the wafer unit 100 to and on the chuck table 3 with the dicing tape T interposed therebetween. Further, the annular frame F of the wafer unit 100 is fixed by the clamp mechanism 33 described hereinabove.

After the wafer unit 100 is held on the chuck table 3 in this manner, the controller 20 actuates processing feeding means not depicted to move the chuck table 3 on which the wafer unit 100 is held to a position just below the alignment means 5. Then, the controller 20 actuates the alignment means 5 to carry out an alignment process for performing positioning between the cutting region of the semiconductor wafer 10 of the wafer unit 100 and the cutting blade 43. In particular, the controller 20 actuates the alignment means 5 to detect a scheduled division line 101 formed in a predetermined direction of the semiconductor wafer 10 and decides whether or not the scheduled division line 101 formed in the predetermined direction extends in parallel to the X-axis direction. If the scheduled division line 101 does not extend in parallel to the X-axis direction, then the controller 20 actuates the rotation mechanism not depicted to control rotation of the chuck table 3 to adjust the scheduled division line 101 so as to extend in parallel to the X-axis direction. Also for a scheduled division line 101 which is formed on the semiconductor wafer 10 and extends in a direction orthogonal to the predetermined direction, an alignment process of the cutting region is carried out similarly.

After the alignment process described above is carried out, the controller 20 actuates the processing feeding means not depicted to move the chuck table 3 on which the wafer unit 100 is held to the processing region by the cutting blade 43 to position one end of the predetermined scheduled division line 101 formed on the semiconductor wafer 10 just below the cutting blade 43. Then, the controller 20 actuates the cutting blade 43 to perform cutting feeding by a predetermined amount in a direction indicated by an arrow mark Z and rotates the cutting blade 43 in a predetermined direction while the chuck table 3 to and on which the wafer unit 100 is sucked and held is moved at a predetermined processing feeding speed in a direction indicated by an arrow mark X which is the processing feeding direction (direction orthogonal to the rotary shaft of the cutting blade 43) to form a cutting groove along the predetermined scheduled division line 101 by the cutting blade 43 so as to extend the dicing tape T. As a result, the semiconductor wafer 10 is cut along the scheduled division line 101 (cutting process). After the semiconductor wafer 10 is cut along the predetermined scheduled division line 101 in this manner, the chuck table 3 is fed for indexing by a distance between the scheduled division lines 101 in a direction indicated by an arrow mark Y, and then the cutting process described above is carried out. Then, after the cutting process is performed along all of the scheduled division lines 101 extending in the first direction on the semiconductor wafer 10, the chuck table 3 is rotated by 90 degrees, and the cutting process is executed along the scheduled division lines 101 extending in the direction orthogonal to the first direction on the semiconductor wafer 10. Consequently, the semiconductor wafer 10 is cut along all of the scheduled division lines 101 formed in a lattice pattern thereon and thereby divided into individual devices. It is to be noted that the divided devices do not come apart due to an action of the dicing tape T but a state of the semiconductor wafer 10 supported on the annular frame F with the dicing tape T interposed therebetween is maintained.

After the cutting process is carried out along the scheduled division lines 101 formed on the semiconductor wafer 10 of the wafer unit 100 in such a manner as described above, the controller 20 actuates the processing feeding means not depicted to return the chuck table 3 on which the wafer unit 100 is held to the workpiece removing position at which the wafer unit 100 was sucked and held first. Then, the controller 20 actuates the second workpiece transport means 14 to transport the wafer unit 100 on the chuck table 3 to the cleaning means 13. Then, the controller 20 actuates the cleaning means 13 to clean the semiconductor wafer 10 for which the cutting process has been performed and then dry the cleaned semiconductor wafer 10. Then, the controller 20 actuates the first workpiece transport means 12 to transport the wafer unit 100 including the semiconductor wafer 10 cleaned and dried by the cleaning means 13 to the first bottom wall 911 of the first support rail 91 and the second bottom wall 921 of the second support rail 92 which configure the temporary receiving means 9. The wafer unit 100 transported to the first support rail 91 and the second support rail 92 which configure the temporary receiving means 9 in this manner is subsequently subjected to a processed state detection process for detecting a processed state of the semiconductor wafer 10 for which the cutting processing has been performed by the cutting process as described above.

Figure 6:
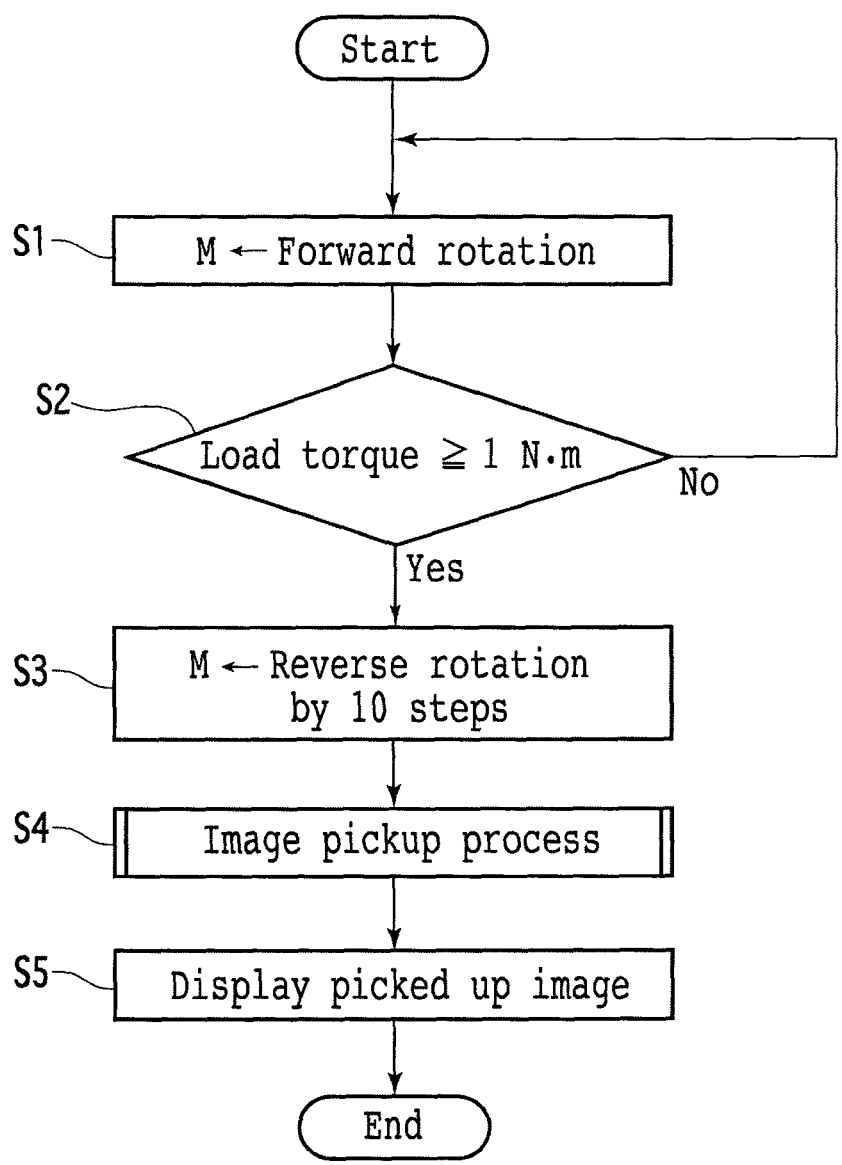
FIG. 6 is a flow chart illustrating a procedure of a processed state detection process carried out by the controller depicted in FIG. 5.

In the following, the processed state detection process is described with reference to the flow chart depicted in FIG. 6 and FIG. 4. First at step S1, the controller 20 actuates the stepping motor 96 (M), which configures the support rail actuation means 93 of the temporary receiving means 9, to rotate forwardly to move the first movement block 94a and the second movement block 94b in the directions in which they are spaced away from each other thereby to move the first support rail 91 and the second support rail 92 connected to each other by the first links 931a and 931b and the second links 932a and 932b in the directions in which they approach each other. As a result, the annular frame F of the wafer unit 100 is sandwiched by the first side wall 912 of the first support rail 91 and the second side wall 922 of the second support rail 92, whereupon the load on the stepping motor 96 (M) increases. Then, the processing advances to step S2, at which the controller 20 receives a load signal from the torque measuring instrument 97 for detecting the load on the stepping motor 96 (M) as an input thereto and checks whether or not the load torque is equal to or higher than 1 N·m. If the load toque is lower than 1 N·m, then the controller 20 decides that the annular frame F is not sandwiched with certainty by the first side wall 912 of the first support rail 91 and the second side wall 922 of the second support rail 92 and returns the processing to step S1 to execute the steps S1 and S2 repetitively.

On the other hand, if it is decided at step S2 that the load toque is equal to or higher than 1 N·m, then the controller 20 decides that the annular frame F is sandwiched with certainty by the first side wall 912 of the first support rail 91 and the second side wall 922 of the second support rail 92 until the load torque reaches the predetermined value (1 N·m) and advances the processing to step S3, at which the controller 20 actuates the stepping motor 96 (M) to rotate reversely by a predetermined amount, for example, by 10 steps. As a result, the first movement block 94a and the second movement block 94b are moved in the directions in which they are spaced away from each other thereby to move the first support rail 91 and the second support rail 92 connected to each other by the first links 931*a* and 931*b* and the second links 932*a* and 932*b* by a predetermined amount in the directions in which they are spaced away from each other. Along with this, between the first side wall 912 of the first support rail 91 and the second side wall 922 of the second support rail 92 and the annular frame F of the wafer unit 100, a very small gap (for example, of 0.1 mm) with which no play appears between them is formed. Accordingly, the wafer unit 100 supported on the first support rail 91 and the second support rail 92 can move smoothly without performing rocking motion under the guidance of the first side wall 912 of the first support rail 91 and the second side wall 922 of the second support rail 92.

After a very small gap with which no play is produced between the first side wall 912 of the first support rail 91 and second side wall 922 of the second support rail 92 and the annular frame F of the wafer unit 100 by executing the step S3 described above, the controller 20 advances the processing to step S4, at which an image pickup process of picking up an image of a processed state of cutting grooves formed on the semiconductor wafer 10 for which the cutting processing has been performed by the cutting process is carried out. In particular, the controller 20 actuates the actuation means not depicted of the unloading and loading means 11 to move the movable block 111 forwardly until the annular frame F of the wafer unit 100 supported on the first support rail 91 and the second support rail 92 of the temporary receiving means 9 is grasped by the pair of grip pieces 112. The controller 20 further actuates the actuation means not depicted forwardly to move the wafer unit 100 toward the cassette 8 placed on the cassette receiving means 7.

At this time, although the annular frame F of the wafer unit 100 is guided by the first side wall 912 of the first support rail 91 and the second side wall 922 of the second support rail 92, since such a very small gap with which no play is produced as described above is formed between the annular frame F and the first side wall 912 of the first support rail 91 and the second side wall 922 of the second support rail 92, the wafer unit 100 can be moved smoothly without making a rocking motion. In this manner, when the wafer unit 100 is moved toward the cassette 8 placed on the cassette receiving means 7 under the guidance of the first side wall 912 of the first support rail 91 and the second side wall 922 of the second support rail 92, the controller 20 actuates the image pickup means 15 to pick up an image of a processed state of cutting grooves formed along predetermined scheduled division lines 101 of the semiconductor wafer 10 as described hereinabove. Then, the image pickup means 15 sends a picked up image signal to the controller 20.

After the image pickup process at step S4 described above is carried out, the controller 20 temporarily stores the image signal sent thereto from the image pickup means 15 into the random access memory (RAM) 203. Thereafter, the controller 20 advances the processing to step S5, at which it controls the display means 6 to display the image of the cutting grooves formed along the predetermined scheduled division lines 101 of the semiconductor wafer 10 on the basis of the image signal sent thereto from the image pickup means 15.

By displaying the image of the cutting grooves formed along the scheduled division lines 101 of the semiconductor wafer 10 for which the cutting processing has been performed by the cutting process on the display means 6 in such a manner as described above, the operator can confirm whether or not the processed state of the cutting grooves is acceptable. Then, if the operator decides that the processed state of the cutting grooves displayed on the display means 6 is not acceptable, then the operator can take a countermeasure such as exchange of the cutting blade.

It is to be noted that the wafer unit 100 for which the image pickup process described above is carried out is transported further to the cassette receiving means 7 side by the unloading and loading means 11 and accommodated into the cassette 8 placed on the cassette receiving means 7.

Although the present invention has been described on the basis of the embodiment depicted in the drawings, the present invention is not limited to the embodiment described above, but various modifications are possible without departing from the spirit and scope of the present invention. For example, while an example in which the present invention is applied to the cutting apparatus 1 is described in the description of the embodiment depicted in the drawings, the present invention may be applied to a laser processing apparatus which detects a processed state of laser processed grooves obtained by laser processing.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
    a chuck table, configured to hold a workpiece thereon;
    processing means for processing the workpiece held on the chuck table;
    a cassette having a plurality of workpieces accommodated therein;
    unloading and loading means for unloading and loading a selected workpiece from and to the cassette;
    a temporary receiving assembly for temporarily receiving thereon the workpiece unloaded by the unloading and loading means;
    wherein the temporary receiving assembly includes:
        a first support rail having a first bottom wall and a first side wall for guiding a workpiece for sliding movement in unloading and loading directions of the workpiece by the unloading and loading means,
        a second support rail disposed in an opposing relationship to the first support rail and having a second bottom wall and a second side wall for guiding a workpiece for sliding movement,
        support rail actuation means for actuating the first support rail and the second support rail in directions in which the first support rail and the second support rail approach each other and are spaced away from each other, and
        load detection means for detecting a load on the support rail actuation means,
    the processing apparatus further having:
    a controller configured to receive, as an input thereto, a load signal from the load detection means when the support rail actuation means is actuated to move the first support rail and the second support rail so as to approach each other thereby to sandwich a workpiece between the first side wall and the second side wall and actuate, when a load value from the load detection means reaches a given value, the support rail actuation means so as to move the first support rail and the second support rail in the directions in which the first support rail and the second support rail are spaced away from each other by a given amount.

2. The processing apparatus according to claim 1, wherein the workpiece is a wafer having a surface having a plurality of regions partitioned by a plurality of scheduled division lines and devices formed in the regions, and the wafer is stuck to a surface of a dicing tape having an outer peripheral portion mounted such that a rear face thereof covers an inner side opening portion of an annular frame.

3. The processing apparatus according to claim 1, wherein image pickup means for picking up an image of the workpiece temporarily placed on the first support rail and the second support rail is disposed on an upper side of the temporary receiving means, and the image pickup means picks up an image of a processed state of the workpiece which moves along the first support rail and the second support rail when the processed workpiece is to be accommodated into the cassette placed on the cassette receiving means by the unloading and loading means.

* * * * *